United States Patent
Jung (10) Patent No.: US 9,823,297 B2
(45) Date of Patent: Nov. 21, 2017

(54) DEGRADATION DETECTION CIRCUIT AND DEGRADATION ADJUSTMENT APPARATUS INCLUDING THE SAME

(71) Applicant: SK hynix Inc., Icheon-si Gyeonggi-do (KR)

(72) Inventor: Ho Don Jung, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 306 days.

(21) Appl. No.: 14/729,876

(22) Filed: Jun. 3, 2015

(65) Prior Publication Data

US 2016/0216315 A1    Jul. 28, 2016

(30) Foreign Application Priority Data

Jan. 28, 2015 (KR) .................. 10-2015-0013738

(51) Int. Cl.
*H02H 3/10* (2006.01)
*G01R 31/28* (2006.01)
(Continued)

(52) U.S. Cl.
CPC ..... *G01R 31/2882* (2013.01); *G01R 31/2879* (2013.01); *G11C 29/023* (2013.01);
(Continued)

(58) Field of Classification Search
CPC .. H02H 3/10; H02H 3/20; H02H 3/38; H02H 5/083; H02H 3/093; H02H 7/18; H02H 9/02; G01R 19/0092; G01R 19/0084; G01R 21/00; G01R 23/02; G01R 19/00; G01R 19/2513; G01R 31/40; G01R 19/165;
(Continued)

(56) References Cited

U.S. PATENT DOCUMENTS 7,023,195 B2 * 4/2006 Rosenbaum ........... G01R 25/00
                                                    324/76.53
8,054,252 B2  11/2011 Tada et al.
(Continued)

FOREIGN PATENT DOCUMENTS

KR   1019990037285 A   5/1999

*Primary Examiner* — Patrick Assouad
*Assistant Examiner* — Taqi Nasir
(74) *Attorney, Agent, or Firm* — William Park & Associates Ltd.

(57) ABSTRACT

A degradation detection circuit may include a degradation unit including multiple delay elements driven by a high voltage for degradation. The high voltage for degradation value may be higher than an operation voltage. The degradation unit may be configured to provide a first delayed signal after passing a test signal through the degradation unit, wherein the test signal retains a pulse for a preset time. The degradation detection circuit may include a reference unit including a plurality of delay elements driven by the operation voltage, and configured to provide a second delayed signal after passing the test signal through the reference unit, a delay setting unit configured to provide a third delayed signal by selectively adding delay elements with respect to the second delayed signal, and a delay checking logic configured to detect a delay of the test signal by comparing the first delayed signal and the third delayed signal.

18 Claims, 9 Drawing Sheets

(51) Int. Cl.
  *G11C 29/02* (2006.01)
  *G11C 29/50* (2006.01)
  *G11C 5/04* (2006.01)

(52) U.S. Cl.
  CPC ...... *G11C 29/028* (2013.01); *G11C 29/50012* (2013.01); *G11C 5/04* (2013.01)

(58) Field of Classification Search
  CPC .... G01D 21/00; G01D 11/245; G01D 18/008; G01D 3/10; G01D 11/00; G01D 11/30; G08B 17/10; G08B 29/185; G08B 19/005; G08B 25/14; G08B 27/003; G08B 25/006
  USPC .... 324/750.01, 750.03, 769, 762.02, 762.03, 324/76.35, 76.54, 322, 750.13, 324/750.15–750.19, 750.22, 750.26, 324/750.3, 756.01, 762.01, 555, 762.05; 702/1, 57, 79, 85, 89, 127, 189; 340/1.1, 340/12.1, 12.14, 500, 501, 527; 361/1, 361/23, 28, 71, 74, 75, 78, 79, 83, 88, 89, 361/91.3, 94, 139, 160, 195, 202
  See application file for complete search history.

(56) References Cited

U.S. PATENT DOCUMENTS

| | | | | |
|---|---|---|---|---|
| 9,217,769 | B2* | 12/2015 | Ding | G01R 31/2824 |
| 2006/0017429 | A1* | 1/2006 | Kim | G11C 7/222 |
| | | | | 324/76.61 |
| 2006/0291110 | A1* | 12/2006 | Kanno | H01L 27/0207 |
| | | | | 361/18 |
| 2010/0117697 | A1* | 5/2010 | Kanno | G06F 1/10 |
| | | | | 327/158 |
| 2012/0239310 | A1* | 9/2012 | Ouvrier-Buffet | G01N 23/087 |
| | | | | 702/32 |
| 2013/0002274 | A1* | 1/2013 | Saneyoshi | G01R 31/2849 |
| | | | | 324/750.01 |
| 2013/0147501 | A1* | 6/2013 | Yamagishi | G01R 31/2884 |
| | | | | 324/750.3 |
| 2015/0294843 | A1* | 10/2015 | Chen | H01J 37/32853 |
| | | | | 438/710 |

* cited by examiner

DEGRADATION DETECTION CIRCUIT AND DEGRADATION ADJUSTMENT APPARATUS INCLUDING THE SAME

CROSS-REFERENCES TO RELATED APPLICATION

The present application claims priority under 35 U.S.C. §119(a) to Korean application number 10-2015-0013738, filed on Jan. 28, 2015, in the Korean Intellectual Property Office, which is incorporated herein by reference in its entirety.

BACKGROUND

1. Technical Field

Various embodiments generally relate to a degradation detection circuit and a degradation adjustment apparatus including the same. More particularly, various embodiments relate to a degradation detection circuit having a configuration for detecting the delay of an element degraded by an electrical stress and a degradation adjustment apparatus including the same.

2. Related Art

As properties of a semiconductor device deteriorate in response to temperature or electrical stresses the semiconductor device may fail to perform as expected. Therefore, in order to estimate the reliability of a semiconductor device, an electrical stress or a temperature stress may be optionally applied at an initial fabrication stage of a semiconductor device to detect the possible occurrence of a fail.

However, despite not detecting a fail at an initial fabrication stage, degradation may be induced in a semiconductor device after an electrical stress is applied due to a burn-in test or the like. In this case, the timing margin of an internal operation of the semiconductor device may be distorted due to an increase in the delay amount of an element such as a transistor. If the operation timing margin is distorted, the operational reliability of the entire semiconductor device may not be ensured.

SUMMARY

According to an embodiment, there may be provided a degradation detection circuit. The degradation detection circuit may include a degradation unit including a plurality of delay elements driven by a high voltage for degradation higher. The high voltage for degradation value may be higher than an operation voltage. The degradation unit may be configured to provide a first delayed signal after passing a test signal through the degradation unit, wherein the test signal retains a pulse for a preset time. The degradation detection circuit may include a reference unit including a plurality of delay elements driven by the operation voltage, and configured to provide a second delayed signal after passing the test signal through the reference unit. The degradation detection circuit may include a delay setting unit configured to provide a third delayed signal by selectively adding delay elements with respect to the second delayed signal. The degradation detection circuit may include a delay checking logic configured to detect a delay of the test signal by comparing the first delayed signal and the third delayed signal.

According to an embodiment, there may be provided a degradation adjustment apparatus. The degradation adjustment apparatus may include a test control block configured to generate and provide a test signal retaining a pulse for a preset time. The degradation adjustment apparatus may include a degradation detection circuit configured to generate first and third delayed signals by passing the test signal through pluralities of delay elements driven by an operation voltage and a high voltage for degradation, respectively, wherein the high voltage for degradation is higher than the operation voltage, and may provide delay level signals in response to skews of the first and third delayed signals.

DETAILED DESCRIPTION

Hereinafter, a degradation detection circuit and a degradation adjustment apparatus including the same will be described below with reference to the accompanying drawings through various examples of embodiments.

Various embodiments may be directed to a degradation detection circuit and a degradation adjustment apparatus including the same which may detect the degradation of an element due to an electrical stress and in particular may figure out the degree of degradation.

Various embodiments may be directed to a degradation adjustment apparatus which may figure out and adjust the delay amount of a degradation-detected element, thereby being capable of posteriorly compensating for degradation.

According to the embodiments, the degradation detection circuit may detect degradation due to an electrical stress applied after an initial fail detection stage. Therefore, since the degradation adjustment apparatus including the degradation detection circuit may detect and adjust degradation after the initial fail detection stage, it may be possible to prevent a property of an entire semiconductor device from deteriorating, whereby the reliability of the semiconductor device may be improved.

Figure 1:
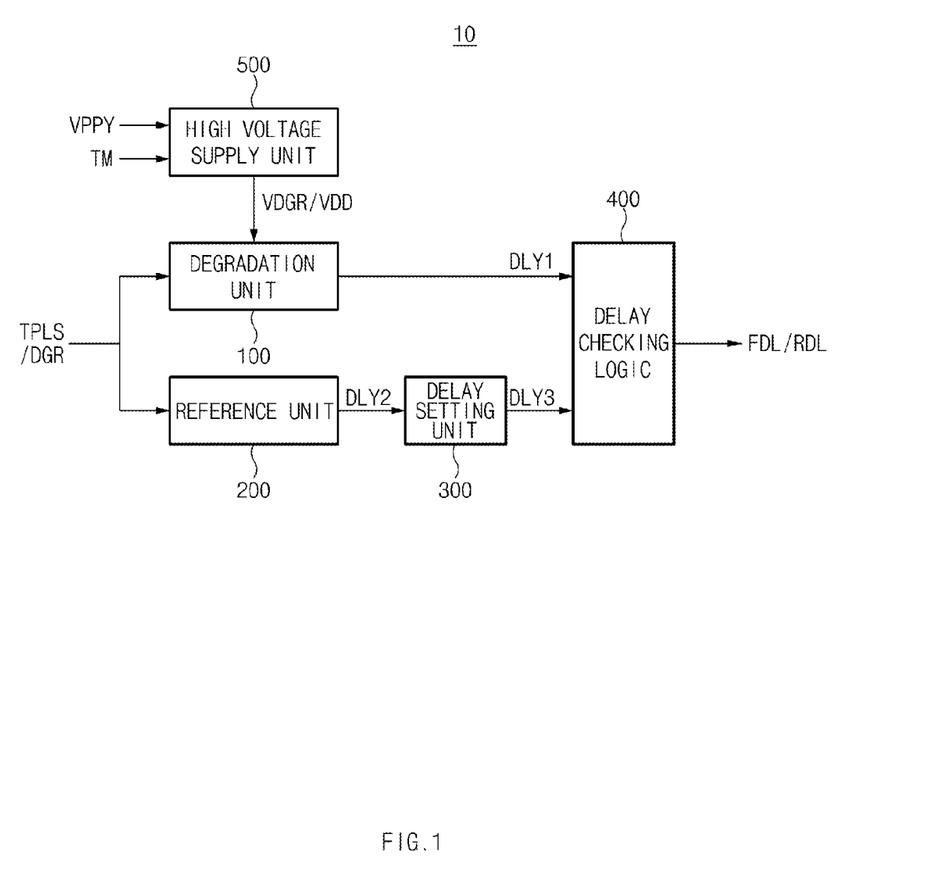
FIG. 1 is a block diagram illustrating a representation of an example of a degradation detection circuit in accordance with an embodiment.

FIG. 1 is a block diagram illustrating a representation of an example of a degradation detection circuit in accordance with an embodiment.

Referring to FIG. 1, a degradation detection circuit 10 in accordance with an embodiment may include a degradation unit 100, a reference unit 200, a delay setting unit 300, and a delay checking logic 400.

The degradation detection circuit 10 may include a plurality of elements operating based on a general operation voltage VDD, and having the degradation unit 100 operating based on a high voltage for degradation VDGR. The high voltage for degradation VDGR may be higher or greater than the operation voltage VDD.

The degradation unit 100 may be constructed by a plurality of delay elements driven by the high voltage for degradation VDGR. The reference unit 200 may be constructed by a plurality of delay elements driven by the operation voltage VDD.

By constructing the degradation unit 100 and the reference unit 200 by transistors having the same properties, the degrees of degradation of the transistors in the examples where the general operation voltage VDD and the high voltage for degradation VDGR are applied may be measured.

Before measuring degradation, as a degradation signal DGR, the degradation signal DGR periodically toggling or retaining the same DC value for a predetermined time, may be applied to the degradation unit 100 and the reference unit 200, a degradation process may proceed.

Thereafter, a test signal TPLS retaining pulses for a preset time is provided in substantially the same manner to the degradation unit 100 and the reference unit 200. The test signal TPLS may be provided from, for example but not limited to, an external test control block 20 (see FIG. 7).

By providing the test signal TPLS retaining pulses for the preset time, the degradation detection circuit 10 in accordance with an embodiment may determine degradation characteristics at the rising edge and the falling edge of the test signal TPLS.

The degradation unit 100 may delay the test signal TPLS and may provide a first delayed signal DLY1. The reference unit 200 may delay the test signal TPLS and may provide a second delayed signal DLY2.

The delay setting unit 300 may selectively add delay elements with respect to the second delayed signal DLY2, and may provide a third delayed signal DLY3. The delay setting unit 300 may be configured to detect degradation, and may selectively add delay elements to determine the degree of degradation.

When detecting occurrence of the degradation, the number of the delay elements added in the delay setting unit 300 may correspond to the difference between the delay elements included in the degradation unit 100 and the delay elements included in the reference unit 200. In this example, since the test signal TPLS passes through the same number of delay elements in the path defined through the degradation unit 100 and the path defined through the reference unit 200 and the delay setting unit 300, if degradation occurs according to the high voltage for degradation VDGR, the first delayed signal DLY1 will be delayed more than the third delayed signal DLY3.

According to the above-described scheme, if the occurrence of degradation is detected, it may be possible to figure out to what degree of delay has been induced by degradation.

The delay setting unit 300 may add a larger number of delay elements than the example of detecting the occurrence itself of degradation as described above, and may provide the second delayed signal DLY2 as the third delayed signal DLY3. For example, after intentionally delaying the second delayed signal DLY2 by adding delay elements driven by the normal operation voltage VDD, the third delayed signal DLY3 and the first delayed signal DLY1 are compared. If the two signals are synchronized with each other, it may be determined that a delay by the delay elements added in the delay setting unit 300 has occurred by degradation.

Operations of the delay setting unit 300 will be described later with reference to FIG. 2.

The delay checking logic 400 may compare the first delayed signal DLY1 and the third delayed signal DLY3, and may detect the delay of the test signal TPLS. The delay checking logic 400 may detect the mismatches of the first delayed signal DLY1 and the third delayed signal DLY3, and generate delay pulses FDL and RDL.

Through pulse generation in the delay checking logic 400, it may be determined that a delay has occurred in the degradation unit 100 at a certain time. The delay checking logic 400 in accordance with an embodiment may generate the delay pulses FDL and RDL by respectively detecting the mismatches, that is, skews, of the rising edge and the falling edge of the test signal TPLS.

If no pulse is generated in the delay checking logic 400, it may be determined that the first delayed signal DLY1 and the third delayed signal DLY3 are synchronized with each other.

According to an embodiment, the degradation detection circuit 10 in accordance with an embodiment may further include a high voltage supply unit 500. The high voltage supply unit 500 may provide an internal high voltage VPPY as the high voltage for degradation VDGR in response to a test mode signal TM. The test mode signal TM may be provided from an external device such as, for example but not limited to, a host. The test mode signal TM may be set in such a manner that the high voltage for degradation VDGR with different levels is generated based on the internal high voltage VPPY.

According to an embodiment, the high voltage supply unit 500 may be configured to provide the operation voltage VDD as it is.

In the degradation detection circuit 10 in accordance with an embodiment, the operation voltage VDD and the high voltage for degradation VDGR are respectively applied to elements of the same property which construct circuits, such that the elements operate by the operation voltage VDD and the high voltage for degradation VDGR, and whether degradation has occurred is detected by determining the skews caused by the elements. If degradation has occurred, by selectively adding delay elements, to which the path wherein the degradation has not been occurred, degradation may be determined and it may be possible to compensate for the degradation.

Figure 2:
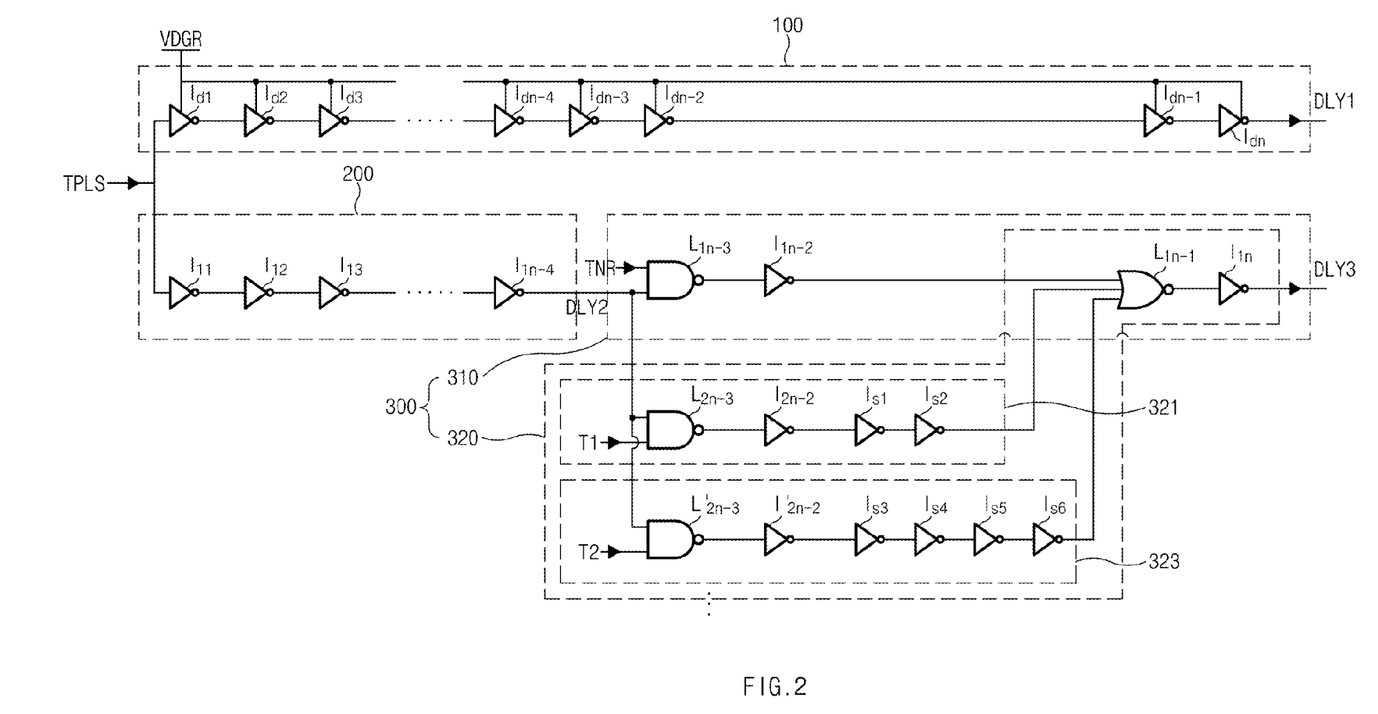
FIG. 2 is a circuit diagram illustrating a representation of an example of a partial configuration of the degradation detection circuit in accordance with an embodiment.

FIG. 2 is a circuit diagram illustrating a representation of an example of a partial configuration of the degradation detection circuit in accordance with an embodiment.

In FIG. 2, the degradation unit 100, the reference unit 200, and the delay setting unit 300 are illustrated.

Referring to FIG. 2, the degradation unit 100 may include a plurality of delay elements $I_{d1}$, $I_{d2}$, $I_{d3}$, ..., $I_{dn-4}$, $I_{dn-3}$, $I_{dn-2}$, $I_{dn-1}$ and $I_{dn}$. The plurality of delay elements $I_{d1}$, $I_{d2}$, $I_{d3}$, ..., $I_{dn-4}$, $I_{dn-3}$, $I_{dn-2}$, $I_{dn-1}$ and $I_{dn}$ may operate with the high voltage for degradation VDGR. While the embodiments illustrate an example in which the delay elements are illustrated as inverters and descriptions will be made based thereon, it is to be noted that the embodiments are not limited to such an example and other elements may be implemented instead of or in addition to the inverters.

The plurality of delay elements $I_{d1}$, $I_{d2}$, $I_{d3}$, ..., $I_{dn-4}$, $I_{dn-3}$, $I_{dn-2}$, $I_{dn-1}$ and $I_{dn}$ may be operated with the high voltage for degradation VDGR, pass the test signal TPLS, and may provide the first delayed signal DLY1.

For example, in the plurality of delay elements $I_{d1}$, $I_{d2}$, $I_{d3}$, ..., $I_{dn-4}$, $I_{dn-3}$, $I_{dn-2}$, $I_{dn-1}$ and $I_{dn}$, PMOS transistors and NMOS transistors may be coupled in series, repeatedly perform a pull-up operation and a pull-down operation, and finally provide the first delayed signal DLY1.

According to differences in the driving capabilities of the PMOS transistors or the NMOS transistors, a delay time at a rising edge or a falling edge may be increased. Thus, the delay checking logic 400 in accordance with an embodiment may provide the delay pulses FDL and RDL (see FIG. 1). The delay pulses FDL and RDL may notify detection of delay amount differences at a rising edge and a falling edge of the first delayed signal DLY1 and the third delayed signal DLY3.

The reference unit 200 may include a plurality of delay elements $I_{11}$, $I_{12}$, $I_{13}$, ... and $I_{1n-4}$. The delay elements $I_{11}$, $I_{12}$, $I_{13}$, ... and $I_{1n-4}$ may be operated with the operation voltage VDD, delay the test signal TPLS, and may provide the second delayed signal DLY2.

The delay setting unit 300 may include a first delay setter 310 and a second delay setter 320.

The first delay setter 310 may provide the second delayed signal DLY2 as the third delayed signal DLY3 by adding delay elements by the difference between the plurality of delay elements $I_{d1}$, $I_{d2}$, $I_{d3}$, ..., $I_{dn-4}$, $I_{dn-3}$, $I_{dn-2}$, $I_{dn-1}$ and $I_{dn}$ included in the degradation unit 100 and the plurality of delay elements $I_{11}$, $I_{12}$, $I_{13}$, ..., and $I_{dn-4}$ included in the reference unit 200. Accordingly, the first delay setter 310 may include, for example but not limited to, 4 delay elements. For example, the first delay setter 310 may include a first logic element $L_{1n-3}$, a second logic element and two inverters $I_{1n-2}$ and $I_{1n}$.

The first logic element $L_{1n-3}$ may perform a NAND logic function on a degradation detection test signal TNR and the second delayed signal DLY2. The degradation detection test signal TNR may be provided to enable the operation of the first delay setter 310. The second logic element $L_{1n-1}$ may perform a NOR logic function that selectively provides one of the delayed signals received from the first delay setter 310 and the delayed signals provided from the second delay setter 320.

The first logic element $L_{1n-3}$ may cause the second delayed signal DLY2 to be provided through the first delay setter 310 only in the example where the degradation detection test signal TNR is enabled. The second logic element $L_{1n-1}$ may cause one signal among a plurality of delayed signals to be provided as the third delayed signal DLY3.

The second delay setter 320 may include one or more delay setting lines 321 and 323. Each of the delay setting lines 321 and 323 may include more delay elements than the first delay setter 310.

For example, the first delay setting line 321 may include two more delay elements than the first delay setter 310. For example, the second delay setting line 323 may include four more delay elements than the first delay setter 310.

The first delay setting line 321 and the second delay setting line 323 may be enabled in response to a first delay amount adjustment test signal T1 and a second delay amount adjustment test signal T2, respectively.

For example, if the first delay amount adjustment test signal T1 is enabled, the second delayed signal DLY2 is inverted by a third logic element $L_{2n-3}$ constructing the first delay setting line 321, and is provided as the third delayed signal DLY3 by passing through inverters $I_{2n-2}$, $I_{s1}$ and $I_{s2}$, the second logic element $L_{1n-1}$ and the inverter $I_{1n}$.

For example, if the second delay amount adjustment test signal T2 is enabled, the second delayed signal DLY2 is inverted by a fourth logic element $L'_{2n-3}$ constructing the second delay setting line 323, and is provided as the third delayed signal DLY3 by passing through inverters $I'_{2n-2}$, $I_{s3}$, $I_{s4}$, $I_{s5}$ and $I_{s6}$, the second logic element $L_{1n-1}$ and the inverter $I_{1n}$.

The second delay setter 320 may include a plurality of delay setting lines including different numbers of delay elements. The second delayed signal DLY2 having passed through the first delay setting line 321 or the second delay setting line 323 may be provided as the third delayed signal DLY3 while having a different delay time.

As described above, the third delayed signal DLY3 having a different delay time may be generated by selectively enabling the delay setting lines (i.e., 321, 323) of the second delay setter 320. The delay checking logic 400 (see FIG. 1) may compare the first delayed signal DLY1 and the third delayed signal DLY3, and may determine that the first delayed signal DLY1 and the third delayed signal DLY3 have the same phase depending on which delay setting line is enabled.

The descriptions made above with reference to FIG. 2 illustrate examples in which the numbers of pluralities of delay elements are exemplarily given, and it is to be noted that the embodiments are not limited to such an example. For example, the numbers of delay elements may be more or less.

Figure 3:
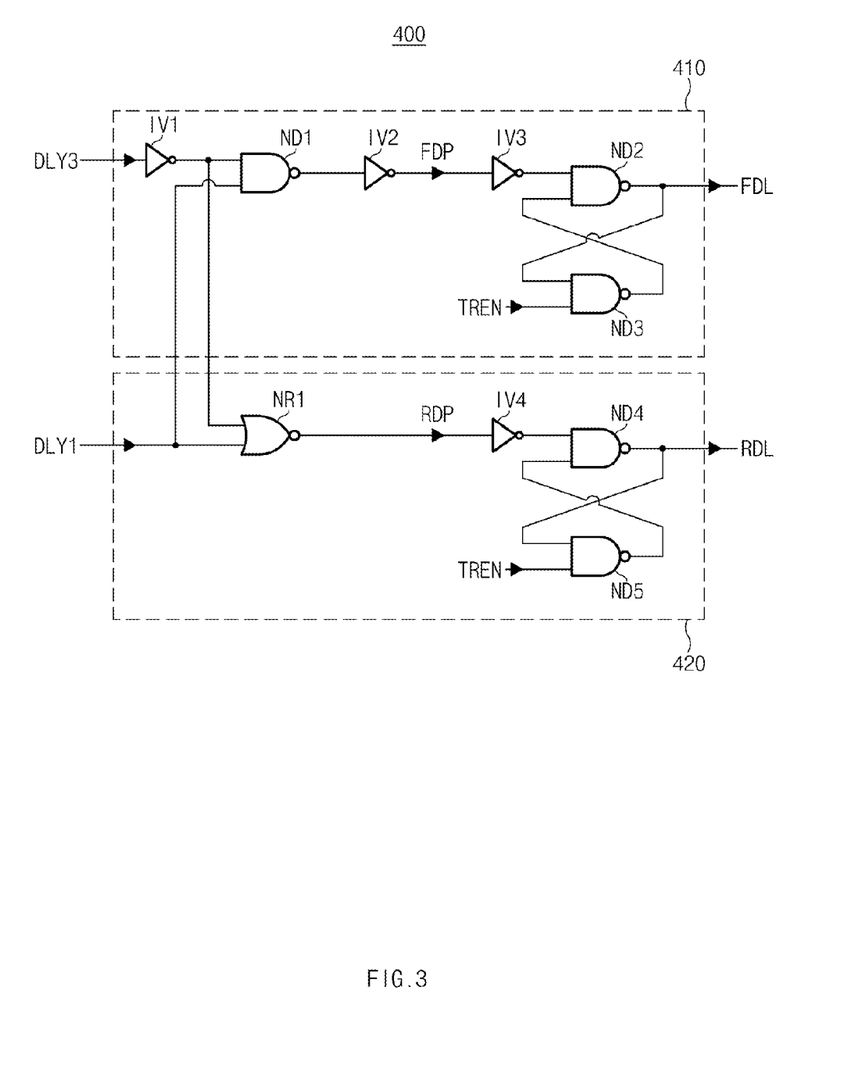
FIG. 3 is a diagram illustrating a representation of an example of the delay checking logic of the degradation detection circuit in accordance with an embodiment.

FIG. 3 is a diagram illustrating a representation of an example of the delay checking logic of the degradation detection circuit in accordance with an embodiment.

Referring to FIG. 3, the delay checking logic 400 may include a falling delay checking logic 410 and a rising delay checking logic 420.

The falling delay checking logic 410 may compare the first delayed signal DLY1 and the third delayed signal DLY3, and detect a skew at the falling edges of the respective signals.

The rising delay checking logic 420 may compare the first delayed signal DLY1 and the third delayed signal DLY3, and detect a skew at the rising edges of the respective signals.

The falling delay checking logic 410 may include a fifth logic element ND1. The fifth logic element ND1 may perform, for example, a NAND logic function on the third delayed signal DLY3 inverted by an inverter IV1 with the first delayed signal DLY1. A signal having passed through the fifth logic element ND1 may be inverted again, and may be provided as a falling detection pulse FDP through an inverter IV2.

The falling detection pulse FDP may correspond to a pulse signal. The pulse signal corresponding to the falling detection pulse FDP may be enabled for only a mismatching time at the falling edges of the first delayed signal DLY1 and the third delayed signal DLY3.

The falling detection pulse FDP may pass through an inverter 1V3, and may be provided as a falling delay level signal FDL by passing along with a test read enable signal TREN through sixth and seventh cross-coupled logic elements ND2 and ND3.

The falling delay level signal FDL may be generated in such a manner that, in the example where the test read enable signal TREN is enabled, when the pulse of the falling detection pulse FDP is detected, the falling delay level signal FDL retains a logic high state after the corresponding pulse.

The reason why the falling detection pulse FDP may be generated as the falling delay level signal FDL is because the retention time of the falling detection pulse FDP is short. For example, if the falling detection pulse FDP is generated in the form of a pulse which is retained for a short time, the logic state of the falling delay level signal FDL may be changed. For this reason, by receiving the falling delay level signal FDL at an exterior, it may be possible to easily determine whether degradation has occurred at the falling edge of the test signal TPLS.

The rising delay checking logic 420 may perform a NOR logic function on the first delayed signal DLY1 and the inverted third delayed signal DLY3 through an eighth logic element NR1, and may generate a rising detection pulse RDP.

Similarly to the falling detection pulse FDP, the rising detection pulse RDP may correspond to a pulse signal which is enabled for only a mismatching time in the example where a skew occurs at the rising edges of the first delayed signal DLY1 and the third delayed signal DLY3.

The rising detection pulse RDP may pass through an inverter IV4, and may be provided as a rising delay level signal RDL by passing along with the test read enable signal TREN through ninth and tenth cross-coupled logic elements ND4 and ND5.

The rising delay level signal RDL may be generated in such a manner that, in the example where the test read enable signal TREN is enabled, when the pulse of the rising detection pulse RDP is detected, the rising delay level signal RDL retains a logic high state after the corresponding pulse.

The falling delay level signal FDL and the rising delay level signal RDL may be provided to the exterior through a pad such as, for example but not limited to, a DQ pad. At the exterior, by reading out the level of the falling delay level signal FDL or the rising delay level signal RDL, it may be possible to determine whether degradation has occurred and whether the first delayed signal DLY1 and the third delayed signal DLY3 are synchronized with each other.

Figure 4:
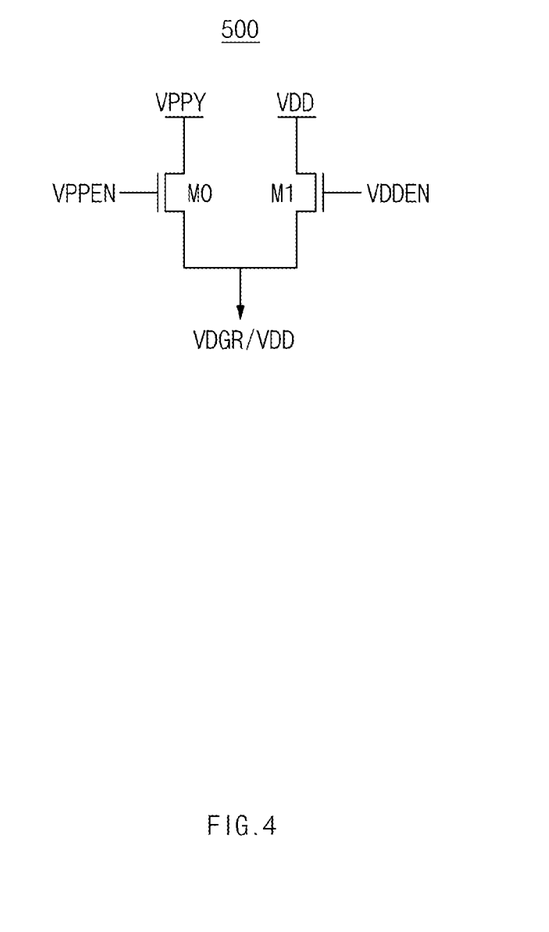
FIG. 4 is a circuit diagram illustrating a representation of an example of the high voltage supply unit of the degradation detection circuit in accordance with an embodiment.

FIG. 4 is a circuit diagram illustrating a representation of an example of the high voltage supply unit of the degradation detection circuit in accordance with an embodiment.

Referring to FIG. 4, the high voltage supply unit 500 may include a first MOS transistor M0. The first MOS transistor M0 may provide the internal high voltage VPPY as the high voltage for degradation VDGR in response to a high voltage enable signal VPPEN. The high voltage supply unit 500 may include a second MOS transistor M1. The second MOS transistor M1 may provide the operation voltage VDD in response to an operation voltage enable signal VDDEN.

The high voltage enable signal VPPEN and the operation voltage enable signal VDDEN illustrated in FIG. 4 may be included in the test mode signal TM (i.e., see FIG. 1). According to an embodiment, the test mode signal TM may have various values and differently change the level of the high voltage for degradation VDGR. As the level of the high voltage for degradation VDGR is changed, because a degradation condition may become different, a degradation condition to test may be set differently by controlling the test mode signal TM.

Figure 5:
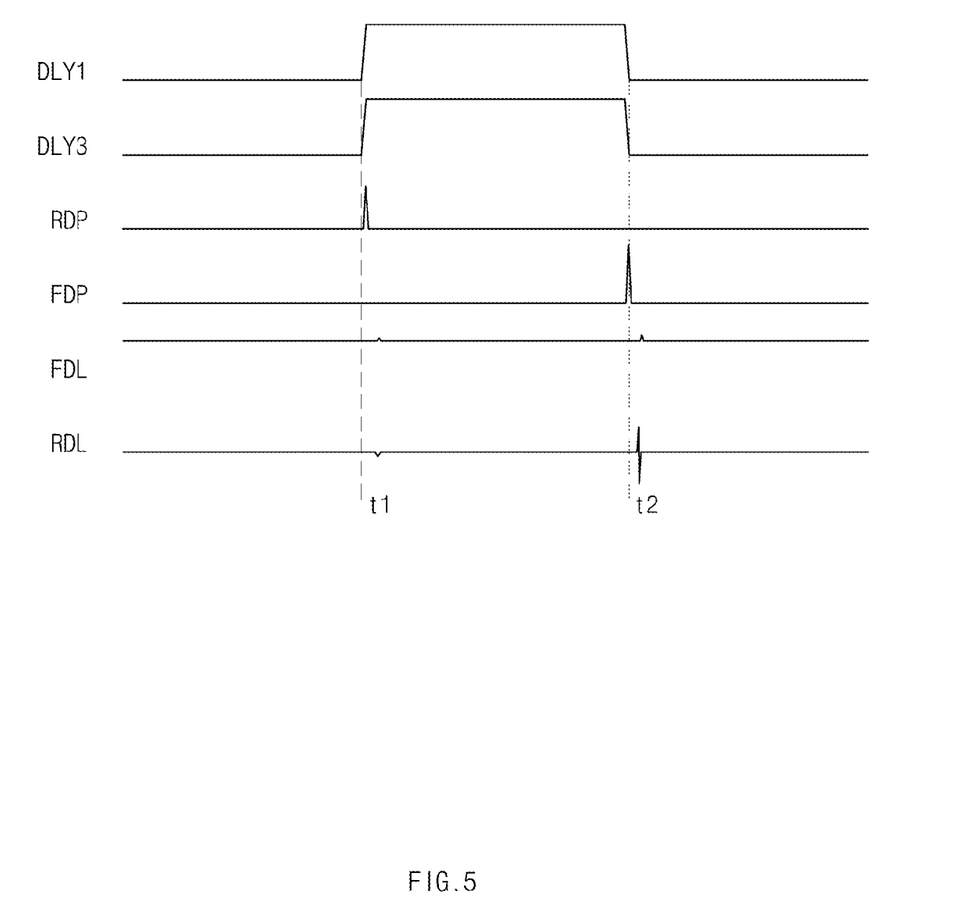
FIGS. 5 and 6 are representations of examples of waveform diagrams illustrating operation waveforms before and after degradation in the degradation detection circuit in accordance with an embodiment.
Figure 6:
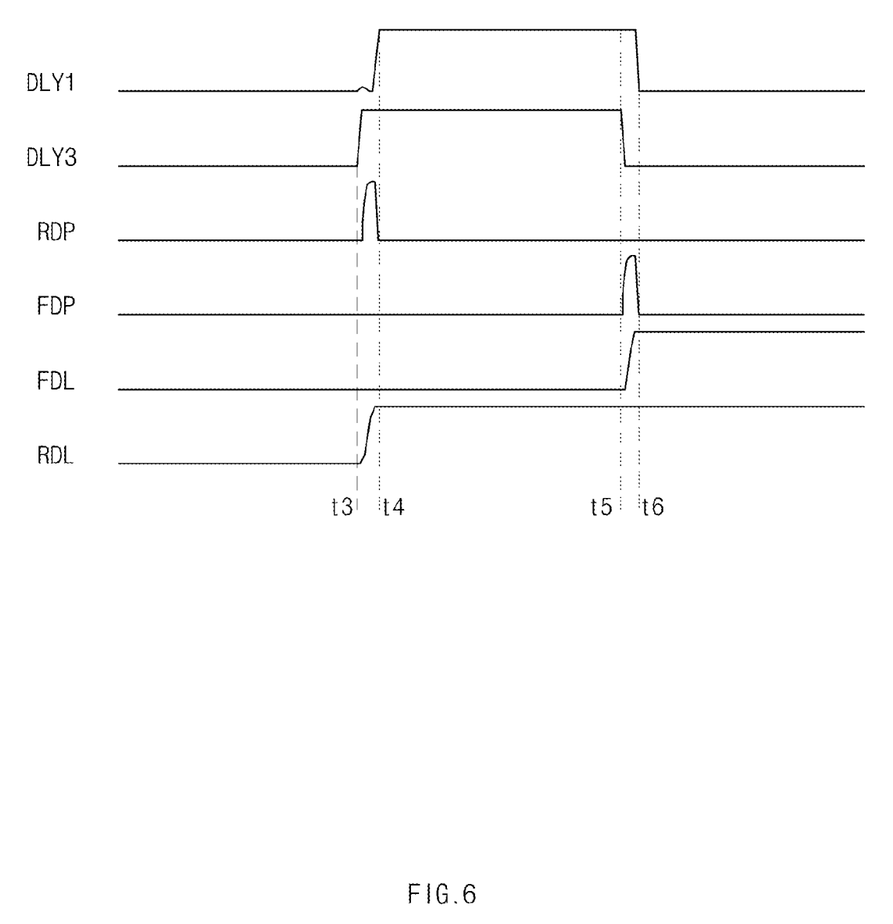

FIGS. 5 and 6 are representations of examples of waveform diagrams illustrating operation waveforms before and after degradation in the degradation detection circuit in accordance with an embodiment.

In the examples represented in FIGS. 5 and 6, the number of the delayed elements consisting the path defined through the degradation unit 100, and the path defined through the reference unit 200 and the delay setting unit 300 are substantially the same.

The operation characteristics of the degradation detection circuit before and after degradation will be described below with reference to FIGS. 5 and 6.

FIG. 5 illustrates the operation characteristic of the degradation detection circuit 10 before degradation or in the example where degradation does not occur. Referring to FIG. 5, it may be seen that the first delayed signal DLY1 and the third delayed signal DLY3 generated by delaying the test signal TPLS have substantially the same waveforms. The first delayed signal DLY1 and the third delayed signal DLY3 have the same delay amount, and rise at a time t1 and fall at a time t2. As such, degradation has not occurred.

In the example where degradation has not occurred, since a mismatch does not exist between the first delayed signal DLY1 and the third delayed signal DLY3, all the rising detection pulse RDP, the falling detection pulse FDP, the falling delay level signal FDL and the rising delay level signal RDL have negligible levels of changes.

FIG. 6 illustrates a representation of an example of an operation of waveforms after degradation has occurred. Unlike the third delayed signal DLY3 which rises at a time t3, the first delayed signal DLY1 rises at a time t4.

That is to say, it is meant that degradation has occurred in the degradation unit 100 and the delay amount of the first delayed signal DLY1 is larger than the delay amount of the third delayed signal DLY3. As a skew occurs between the first delayed signal DLY1 and the third delayed signal DLY3, the rising detection pulse RDP is generated between the time t3 and the time t4. Due to the generation of the rising detection pulse RDP, the rising delay level signal RDL retains the logic high state from the time t3.

Since the first delayed signal DLY1 and the third delayed signal DLY3 are signals generated by delaying the test signal TPLS which is retained for the same time, the first delayed signal DLY1 falls at a time later than the third delayed signal DLY3.

In other words, while the third delayed signal DLY3 falls at a time t5, the first delayed signal DLY1 falls at a time t6. Accordingly, the falling detection pulse FDP is generated, and the falling delay level signal FDL retains the logic high state in response to the falling detection pulse FDP.

According to the rising delay level signal RDL and the falling delay level signal FDL provided from the delay checking logic 400, it may be recognized that degradation has occurred in the degradation unit 100. After it is recognized that degradation has occurred, a degree to which degradation has occurred may be figured out by selectively adding delay elements through the delay setting unit 300.

Figure 7:
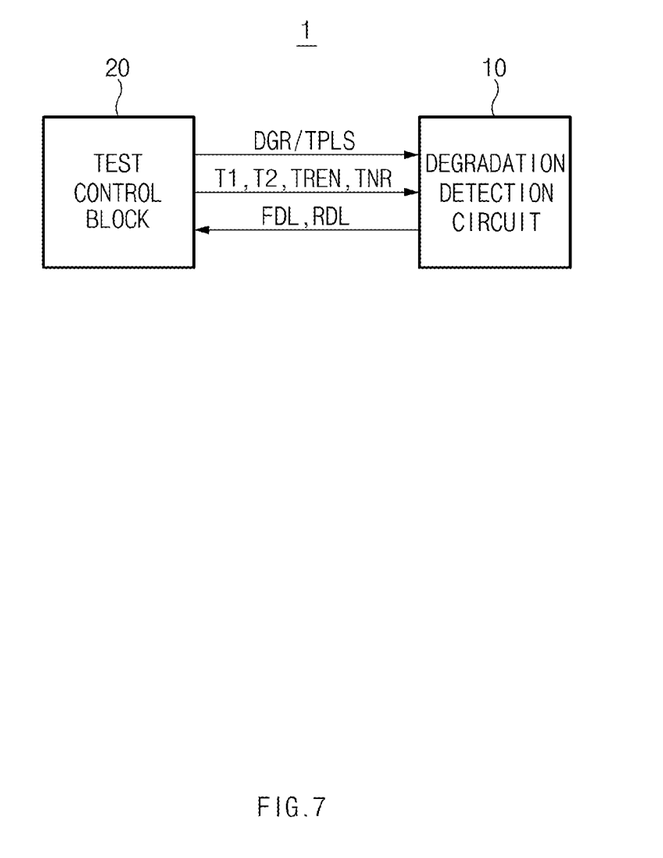
FIG. 7 is a block diagram illustrating a representation of an example of a degradation adjustment apparatus in accordance with an embodiment.

FIG. 7 is a block diagram illustrating a representation of an example of a degradation adjustment apparatus in accordance with an embodiment.

A degradation adjustment apparatus 1 in accordance with an embodiment may include a test control block 20 and a degradation detection circuit 10.

The test control block 20 may generate a test signal TPLS retaining pulses for a preset time, and may provide the generated test signal TPLS to the degradation detection circuit 10.

The degradation detection circuit 10 may generate first and third delayed signals DLY1 and DLY3 by passing the test signal TPLS through pluralities of delay elements driven by an operation voltage VDD and a high voltage for degradation VDGR higher than the operation voltage VDD, respectively, and may provide delay level signals FDL and RDL in response to the skews of the first and third delayed signals DLY1 and DLY3.

Since the degradation detection circuit 10 has substantially the same configuration as described above with reference to FIGS. 1 to 4, detailed descriptions thereof will be omitted herein.

The test control block 20 may be configured in the same chip as the degradation detection circuit 10 or may be realized at an exterior different from the degradation detection circuit 10.

Before checking whether degradation has occurred, the test control block 20 may artificially degrade the degradation detection circuit 10 by providing a degradation signal DGR toggling for a preselected time or retains the same voltage value for a predetermined time, to a degradation unit 100 and a reference unit 200 of the degradation detection circuit 10.

After that, the test control block 20 may provide the test signal TPLS retaining pulses for the preset time, to the degradation detection circuit 10.

In the example where it is necessary to detect occurrence itself of degradation, the test control block 20 enables a first delay setter 310 (i.e., see FIG. 2) of a delay setting unit 300 by enabling a degradation detection test signal TNR. According to this fact, it may be possible to allow the same number of delay elements to be disposed in the degradation unit 100 through which the first delayed signal DLY1 passes and in the reference unit 200 and the delay setting unit 300 through which the third delayed signal DLY3 passes finally.

Thus, the test control block 20 may receive the rising delay level signal RDL and the falling delay level signal FDL generated by the degradation detection circuit 10. According to an embodiment, the rising delay level signal RDL and the falling delay level signal FDL may be provided to the test control block 20 through a pad such as, for example but not limited to, a DQ pad.

The test control block 20 may determine that degradation has occurred, in the example where at least one of the rising delay level signal RDL and the falling delay level signal FDL becomes a logic high state.

According to an embodiment, the falling delay level signal FDL and the rising delay level signal RDL may be outputted only in the example where a test read enable signal TREN is enabled. In the example of reading out the falling delay level signal FDL and the rising delay level signal RDL through a specified pad, the test control block may transmit and receive another signal through the corresponding pad, by controlling the test read enable signal TREN.

In order to determine at which degree degradation has occurred, the test control block 20 selectively enables delay amount adjustment test signals T1 and T2 such that the delay setting lines of a second delay setter 320 (i.e., see FIG. 2) may be selectively to enabled.

In a similar manner, by receiving the falling delay level signal FDL and the rising delay level signal RDL from the degradation detection circuit 10, the test control block 20 may detect whether the falling delay level signal FDL and the rising delay level signal RDL are enabled or not when a certain delay setting line of the second delay setter 320 is enabled.

If the falling delay level signal FDL and the rising delay level signal RDL are not enabled, since a skew has not occurred between the first delayed signal DLY1 and the third delayed signal DLY3, the degree of degradation is determined by the delay time of the delay setting line enabled at a corresponding time.

Figure 8:
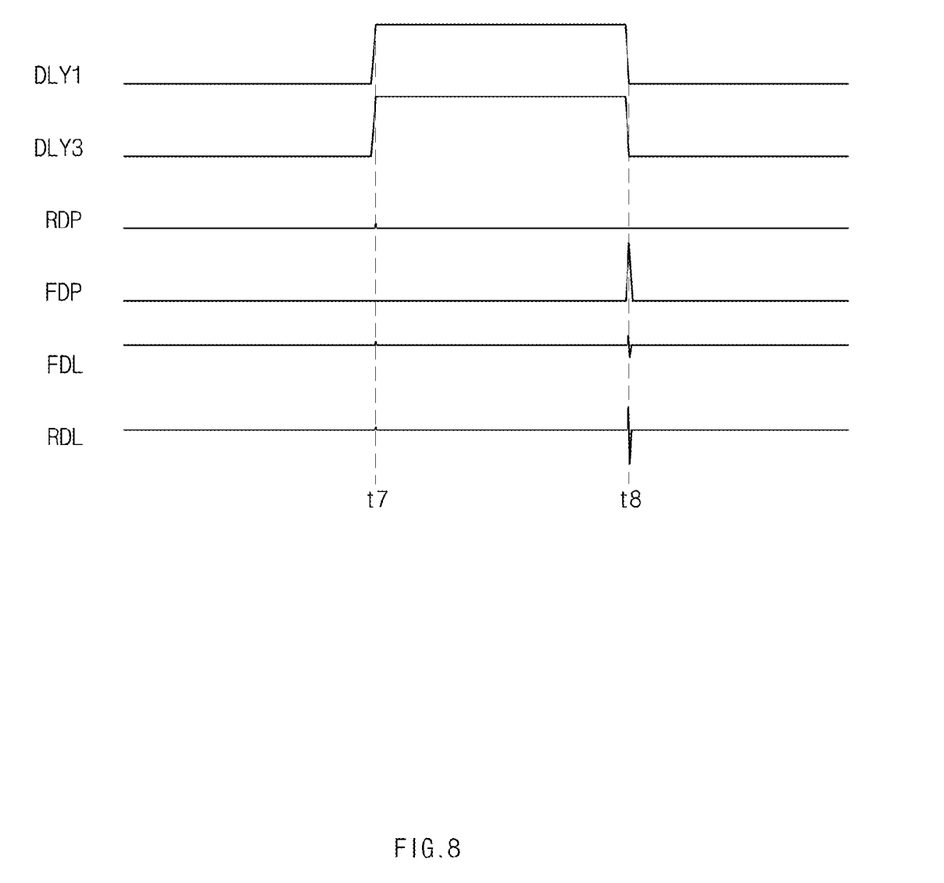
FIG. 8 is a representation of an example of a waveform diagram to assist in the explanation of the examples where a delay amount is adjusted according to setting of a delay setting unit.

FIG. 8 is a representation of an example of a waveform diagram to assist in the explanation of the examples where a delay amount is adjusted according to setting of a delay setting unit.

In FIG. 8, a time t7 may correspond, for example, to the time t4 of FIG. 6. Referring to FIG. 8, it may be seen that, by appropriately selecting a delay setting line of the second delay setter 320 of the delay setting unit 300, the third delayed signal DLY3 rises at the time t7 and falls at a time t8 in the same manner as the first delayed signal DLY1.

As described above with reference to FIG. 5, in final waveforms, no difference is found between the two delayed signals DLY1 and DLY3 similarly to before degradation has occurred, and a rising detection pulse RDP, a falling detection pulse FDP, the rising delay level signal RDL and the falling delay level signal FDL with meaningful values are not enabled.

The test control block 20 may check a delay amount through finely adjusting the second delay setter 320 in this way.

According to an embodiment, the test control block 20 may compensate for a delay time for a circuit tested by the degradation detection circuit 10, based on a figured-out delay time or determined delay time. For example, operation circuits to test may be disposed in the vicinity of the degradation detection circuit 10, and it may be possible to compensate for a delay amount for a circuit in which degradation has occurred, through an E-fuse or the like.

As is apparent from the above descriptions, in the degradation detection circuit and the degradation adjustment apparatus in accordance with the embodiments, occurrence of degradation may be detected by detecting the skews of signals which are respectively delayed by elements operating by a high voltage for degradation and elements operating by a normal operation voltage. Further, the degree of degradation may be checked by figuring out or determining a delay amount when two signals are synchronized with each other, through finely adjusting a delay amount for a degradation-detected circuit.

As a consequence, in the degradation detection circuit and the degradation adjustment apparatus in accordance with the embodiments, even in the example where an electrical stress is posteriorly applied, by detecting occurrence of degradation and figuring out or determining the degree of degradation, it may be possible to applicably compensate for degradation.

The degradation detection circuit 10 and degradation adjustment apparatuses 1 discussed above (see FIGS. 1-8) are particular useful in the design of memory devices, processors, and computer systems. For example, referring to FIG. 9, a block diagram of a system employing a degradation detection circuit and/or a degradation adjustment apparatus in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

Figure 9:
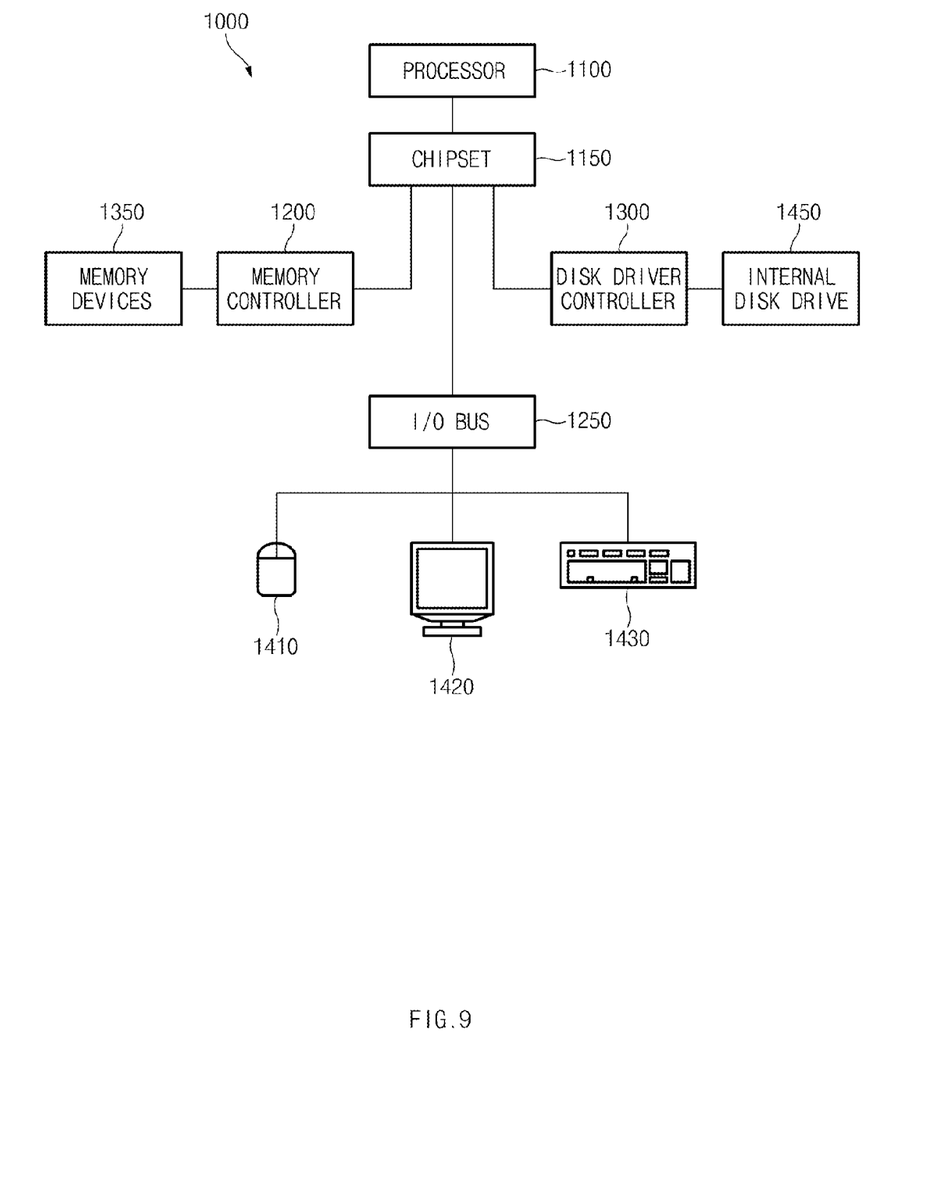
FIG. 9 illustrates a block diagram of an example of a representation of a system employing the degradation adjustment apparatus and/or degradation detection circuit in accordance with the various embodiments discussed above with relation to FIGS. 1-8.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one degradation detection circuit 10 and/or a degradation adjustment apparatus 1 as discussed above with reference to FIGS. 1-8. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one degradation detection circuit 10 and/or a degradation adjustment apparatus 1 as discussed above with relation to FIGS. 1-8, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 9 is merely one example of a system employing a degradation detection circuit 10 and/or a degradation adjustment apparatus 1 as discussed above with relation to FIGS. 1-8. In alternate embodiments, such as cellular phones or digital cameras, the components may differ from the embodiments illustrated in FIG. 9.

While various embodiments have been described above, it will be understood to those skilled in the art that the embodiments described are by way of example only. Accordingly, the degradation detection circuit and the degradation adjustment apparatus including the same described herein should not be limited based on the described embodiments.

What is claimed is:

1. A degradation detection circuit comprising:
    a degradation unit including a plurality of delay elements driven by a high voltage for degradation, wherein the high voltage for degradation value is higher than an operation voltage, and the degradation unit is configured to provide a first delayed signal after passing a test signal through the degradation unit, wherein the test signal retains a pulse for a preset time;
    a reference unit including a plurality of delay elements driven by the operation voltage, and configured to provide a second delayed signal after passing the test signal through the reference unit;
    a delay setting unit configured to provide a third delayed signal by selectively adding delay elements with respect to the second delayed signal; and
    a delay checking logic configured to detect a delay of the test signal by comparing the first delayed signal and the third delayed signal,
    wherein the delay setting unit comprises a first delay setter, the first delay setter providing the second delayed signal as the third delayed signal by adding delay elements by a difference between the plurality of delay elements included in the degradation unit and the plurality of delay elements included in the reference unit.

2. The degradation detection circuit according to claim 1, wherein the delay setting unit further comprises:
    a second delay setter including at least one delay setting line including a greater number of delay elements than a number of delay elements included in the first delay setter.

3. The degradation detection circuit according to claim 2, wherein each of the at least one delay setting line is selectively enabled to adjust a degree of the degradation of the third delayed signal.

4. The degradation detection circuit according to claim 1, wherein the delay setting unit further comprises:
    a second delay setter including a first delay setting line and a second delay setting line,
    wherein the first delay setting line has a greater number of delay elements than a number of delay elements included in the first delay setter, and
    wherein the second delay setting line has a greater number of delay elements than the number of delay elements included in the first delay setting line and the number of delay elements included in the first delay setter.

5. The degradation detection circuit according to claim 4, wherein the first delay setting line has two more delay elements than the number of delay elements included in the first delay setter, and
    wherein the second delay setting line has four more delay elements than the number of delay elements included in the first delay setter.

6. The degradation detection circuit according to claim 1, wherein the delay checking logic comprises:
    a rising delay checking logic configured to provide a rising delay level signal by detecting a delay of the test signal in a rising direction; and
    a falling delay checking logic configured to provide a falling delay level signal by detecting a delay of the test signal in a falling direction.

7. The degradation detection circuit according to claim 1, further comprising:
    a high voltage supply unit configured to provide an internal high voltage as the high voltage for degradation, based on a test mode signal.

8. A degradation adjustment apparatus comprising:
    a test control block configured to generate and provide a test signal retaining a pulse for a preset time; and
    a degradation detection circuit configured to generate first and third delayed signals by passing the test signal through pluralities of delay elements driven by an operation voltage and a high voltage for degradation, respectively, wherein the high voltage for degradation is higher than the operation voltage, and provide a delay level signal in response to a timing difference between the first delayed signal and the third delayed signal, wherein the degradation detection circuit comprises:

a delay checking logic configured to detect a delay of the test signal by comparing the first delayed signal and the third delayed signal and provide the delay level signal having a skew corresponding the delay of the test signal.

9. The degradation adjustment apparatus according to claim 8, wherein the degradation detection circuit comprises:

a degradation unit including the plurality of delay elements, the delay elements driven by the high voltage for degradation, and the degradation unit configured to provide the first delayed signal;

a reference unit including the plurality of delay elements driven by the operation voltage, and configured to provide a second delayed signal by delaying the test signal; and a delay setting unit configured to provide the third delayed signal by selectively adding delay elements with respect to the second delayed signal.

10. The degradation adjustment apparatus according to claim 9, wherein the test control block provides the test signal after applying a degradation signal toggling for a preselected time or retains a preset voltage value for a predetermined time, to the degradation unit and the reference unit.

11. The degradation adjustment apparatus according to claim 9, wherein the delay setting unit comprises a first delay setter configured to provide the second delayed signal as the third delayed signal by adding delay elements by a difference between the plurality of delay elements included in the degradation unit and the plurality of delay elements included in the reference unit.

12. The degradation adjustment apparatus according to claim 11, wherein the delay setting unit further comprises:

a second delay setter including one or more delay setting lines each including a greater number of delay elements than a number of delay elements included in the first delay setter.

13. The degradation adjustment apparatus according to claim 12, wherein the test control block enables the first delay setter by providing a degradation detection test signal, and determines whether degradation has occurred, when the delay level signal is enabled.

14. The degradation adjustment apparatus according to claim 12, wherein the test control block selectively enables the delay setting lines by providing delay amount adjustment test signals, and determines a delay amount of the degradation unit based on delay elements of the second delay setter when the delay level signal is disabled.

15. The degradation adjustment apparatus according to claim 13, wherein the delay checking logic comprises:

a rising delay checking logic configured to provide a rising delay level signal included in the delay level signal, by detecting a delay of the test signal in a rising direction; and a falling delay checking logic configured to provide a falling delay level signal included in the delay level signal, by detecting a delay of the test signal in a falling direction.

16. The degradation adjustment apparatus according to claim 14, wherein the delay checking logic comprises:

a rising delay checking logic configured to provide a rising delay level signal included in the delay level signal, by detecting a delay of the test signal in a rising direction; and a falling delay checking logic configured to provide a falling delay level signal included in the delay level signal, by detecting a delay of the test signal in a falling direction.

17. The degradation adjustment apparatus according to claim 9, wherein the test control block adjusts a magnitude of the high voltage for degradation, by providing a test mode signal.

18. The degradation adjustment apparatus according to claim 17, wherein the degradation detection circuit further comprises:

a high voltage supply unit configured to provide the high voltage for degradation, in response to the test mode signal.

* * * * *